United States Patent [19]

Vikesland et al.

[11] 4,247,616
[45] Jan. 27, 1981

[54] POSITIVE-ACTING PHOTORESIST COMPOSITION

[75] Inventors: John P. Vikesland, Woodbury; Richard M. Presley, St. Paul, both of Minn.

[73] Assignee: Minnesota Mining and Manufacturing Company, Saint Paul, Minn.

[21] Appl. No.: 60,601

[22] Filed: Jul. 27, 1979

Related U.S. Application Data

[63] Continuation-in-part of Ser. No. 939,989, Sep. 6, 1978, abandoned.

[51] Int. Cl.$^3$ .......................... G03C 1/68; G03C 1/52
[52] U.S. Cl. ................................... 430/192; 430/170; 430/271; 430/275; 430/280; 430/278; 430/906
[58] Field of Search ............... 96/91 D, 115 R, 91 R, 96/75, 83, 86 P, 87 R; 430/271, 275, 278, 280, 906, 192, 170, 270, 306

[56] References Cited

U.S. PATENT DOCUMENTS

| 3,295,974 | 1/1967 | Erdmann | 96/115 R |
| 3,634,082 | 1/1972 | Christensen | 96/91 D |
| 3,660,097 | 5/1972 | Mainthia | 96/91 D |
| 3,890,152 | 6/1975 | Ruckert et al. | 96/91 D |
| 3,900,325 | 8/1975 | Christensen et al. | 96/91 D |
| 3,956,043 | 5/1976 | Zahir et al. | 96/115 R |
| 4,148,654 | 4/1979 | Oddi | 430/270 |
| 4,148,655 | 4/1979 | Itoh et al. | 430/270 |

Primary Examiner—Won H. Louie, Jr.
Attorney, Agent, or Firm—Cruzan Alexander; Donald M. Sell; Mark A. Litman

[57] ABSTRACT

A positive-acting light-sensitive composition having excellent utility as a photoresist, comprising: (a) a crosslinked urethane resin formed by a catalyzed crosslinking of a non-heat reactive novalac phenolic resin and a polyisocyanate compound; (b) an epoxy resin having an epoxide equivalent weight of less than about 400 and a curing agent therefor; and (c) a positive-acting photosensitizer.

Upon applying to a substrate and drying, the epoxy resin cures, resulting in a film useful as a photoresist or in the formation of lithographic printing plates.

24 Claims, No Drawings

POSITIVE-ACTING PHOTORESIST COMPOSITION

This application is a continuation-in-part of Ser. No. 939,989 filed Sept. 6, 1978, now abandoned.

In the manufacture of dry photosensitive elements such as lithographic plates, photoresists, and the like, photosensitive compositions are utilized which are either negative-acting or positive-acting. Negative-acting systems are those which become insolubilized in an imagewise fashion upon exposure thereof to actinic radiation. Since the exposed areas are rendered relatively insoluble, selected developing solutions can dissolve or otherwise remove the unexposed portions of the composition while leaving the exposed areas intact. Therefore, the resulting image corresponds to the reverse of the original in terms of contrast, i.e., a negative image. Conversely, with positive-acting systems, exposed portions thereof are rendered more soluble or developable upon exposure to actinic radiation, and as such these portions can be removed with selected developing solutions, the unexposed portions remaining intact. Image formation in this instance yields an image corresponding to the original image in terms of contrast, i.e., yields a positive image.

In the specific area of photoresist manufacture, a photoresist is typically utilized to promote image formation on substrates by imagewise protecting the substrate material from subsequent chemical or physical manufacturing processes, such as chemical etching, vacuum metalization, and electrolytic deposition. In other words, upon exposure and development of the photoresist material, the underlying substrate upon which the photoresist is placed can be exposed to subsequent physical processing in an imagewise fashion, the processing affecting only in areas not protected by the resist material. In the manufacture of copper-clad circuit boards, a photoresist is typically applied to the circuit board surface, and is followed by imaging and development. Subsequent to such initial processing, an etching solution typically is sprayed under high pressure downward onto the substrate, the etchant removing the copper metal which is unprotected by the photoresist, thereby providing an imaged metal circuit configuration after removal of the balance of the photoresist.

In order to accurately reproduce circuit geometries, it is necessary that a photoresist have high adhesion to the substrate to which it is applied and high internal strength. Adhesion is required to prevent excessive undercutting of the resist by the etchant, thereby decreasing image resolution, and internal strength is necessary to maintain proper circuit geometries. Dry film resists should have reasonable flexibility, ability for heat and pressure lamination, reasonably fast exposure capability, excellent development characteristics with moderate pressure sprays of developer solutions, excellent coating quality (e.g., free from physical defects), capability of rapid chemical stripping or removal of the photoresist after use, and the production of a visible image upon exposure thereof to actinic radiation.

Dry negative-acting film resists have of course been known for quite some time. One important feature necessary for any resist is resolution. Positive-acting resists have an inherently higher resolution capability than do their negative-acting counterparts. This difference is due, in part, to the generally necessary presence of an oxygen-impermeable barrier film required prior to and during negative resist exposure, since conventional negative-acting materials are usually oxygen-sensitive.

Some typical resolution requirements in the electronics industry are as follows: In the production of general purpose printed circuit boards, typically 10 mil lines with 10 mil spaces are required; in precision circuits, typically 1 mil lines with 1 mil spaces are necessary; and in the microelectronics industry, better than 0.1 mil lines and spaces are required.

At the present time, the dry film resist market consists of virtually only negative-acting resists. This is essentially because positive-acting film photoresists have not been developed which achieve the criteria noted above. Positive film resists typically exhibit excessive brittleness which allows flaking off of the resist with even moderate flexing of the carrier sheet, coating defects, a lack of internal cohesive strength which causes the resist to fracture during etching, and poor adhesion of the photoresist to the substrate surface.

It has now been ascertained that a novel positive-acting photosensitive composition can be utilized to prepare a dry film photoresist which meets many of the foregoing criteria. In addition, the photosensitive composition, in its cured state, is oleophilic, i.e., ink-receptive, and can therefore be utilized as a coating on aluminum or stainless steel surfaces to provide lithographic printing plates, or in the manufacture of bimetallic printing plates.

In accordance with the invention, there is provided a positive-acting light-sensitive composition having excellent utility as a photoresist, comprising: (a) a crosslinked urethane resin formed by a catalyzed crosslinking of a non-heat reactive novalac phenolic resin and a diisocyanate compound; (b) an epoxy resin having an epoxide equivalent weight of less than about 400 and a curing agent therefor; and (c) a positive-acting photosensitizer.

Upon the preferred application of the composition to a substrate (which may be a temporary support layer and strippable film or a substrate on which the composition is coated prior to processing) and drying, the epoxy resin cures, and the resultant dry film has ideal utility as a dry film photoresist. In addition, the dry film is oleophilic, and therefore can be utilized as a printing plate surface.

In dry coated form, the positive-acting composition of our invention basically comprises two intermixed and intertwined polymeric resin networks. The first of these networks comprises a crosslinked urethane resin formed from crosslinking of a diisocyanate with a novalac phenolic resin, and the second comprises a heat-curable epoxy resin. The resin mixture contains a blended-in amount of a positive-acting photosensitizer to afford light sensitivity to the system.

The urethane resin is formed in solution by the catalyzed crosslinking reaction of a novalac phenolic resin with a polyisocyanate, preferably a tri- or diisocyanate, and most preferably a long-chain diisocyanate compound.

The components used in forming the urethane can be simply dissolved in a suitable solvent together with an appropriate catalyst, whereupon the crosslinking reaction will ensue. When the solution viscosity stabilizes, reaction is complete.

The novalac phenolic resin should typically comprise from about 40 to about 80 and preferably between 50 and 70 percent by weight of the composition, and should not be heat-reactive. Non-heat-reactive according to the present invention means that the resin should not substantially polymerize when heated alone. Substantial polymerization would occur when the average molecular weight increased by at least 10%. Preferably the average molecular weight should increase by less than 4% upon heating, if at all. Increasing novalac concentration may cause increased film brittleness and an undesirable increase in the solubility of the unexposed film areas, which can result in an insufficient solubility differential between exposed and unexposed film areas. Reduced concentrations may cause the film to fail to develop properly after imagewise exposure to actinic radiation. Preferred novalac resins include novalac phenolic/formaldehyde resins of from about 500 to 1000 molecular weight. These resins include those of U.S. Pat. No. 4,148,655 where a number of different phenolic components are used.

Polyisocyanates useful herein include conventional aromatic and aliphatic polyisocyanates. Preferably, the polyisocyanates are of long chain length, i.e., where the isocyanate groups are connected by linkages of from about 10 to about 40 or 50 carbon atoms. Both smaller (e.g., 6 carbon atoms) and larger chain aromatic and aliphatic diisocyanates would of course still be useful in the practice of the present invention. For example, isophoronediisocyanate, toluene diisocyanate and any other diisocyanates are particularly useful. The polyisocyanate should preferably be present in a concentration of from about 6 to about 12 parts by weight per 100 parts of novalac resin present, depending upon the molecular weight or isocyanate equivalent weight of the polyisocyanate. In general, the weight percent should not exceed a range of from about 3 to 20 percent by weight of the novalac resin. Increasing amounts tend to cause the resultant film to be excessively brittle, to have insufficient internal strength, and, in the case of photoresists, to exhibit reduced adhesion to the substrate to which the film is laminated. Reduced amounts tend to cause the film to fail to laminate properly and clean out in exposed areas during development. Any catalyst known to be useful in the catalysis of urethane formation may be used. The most preferred catalysts include tertiary amines, examples of which include 1,4 diazabicyclo-(2,2,2)-octane, and 2,4,6-tris(dimethylaminomethyl) phenol.

Catalyst concentration is not critical, as long as a sufficient amount is present to incure crosslinking. Typically, greater than about 0.05 parts by weight per 100 parts of novalac resin is more than sufficient to insure complete crosslinking, although as little as 0.01 parts can be sufficient.

Once the urethane formation is complete, a polymerizable epoxy resin having an epoxide equivalent weight of less than about 400 is added to the solution, along with a curing agent therefor. A typical and preferred epoxy resin is diglycidyl ether of bisphenol A. Epoxy resin concentrations should be from about 20 to about 40 parts by weight per 100 parts of novalac resin. Increased concentrations tend to increase the flexibility of the resultant dry photosensitive film, but the capability of imagewise exposure and development is reduced. Decreasing concentrations tend to reduce the adhesion and handling characteristics of the resultant dry film.

Exemplary epoxy curing agents include aliphatic or aromatic amines, aliphatic or aromatic anhydrides, disulfones, nitriles, and other known epoxy curing agents. Any of these and other curing agents may be used in practice of the present invention. Preferred curing agents include phthalic anhydride, diamino diphenylsulphone or a combination thereof. Typically, from about 5 to about 50 parts of curing agent per 100 parts of epoxy resin are sufficient to insure curing of the epoxy.

Without inclusion of the epoxy curing agent or successful curing of the epoxy resin, the resultant film tends to be brittle and lacks the internal cohesive strength necessary for photoresist performance. Conversely, when the epoxy is satisfactorily cured, the resultant film has significantly greater flexibility and cohesive strength so as to be extremely useful as a photoresist.

The positive-acting photosensitizer is conveniently added by thorough mixing to the solution containing the urethane, polymerizable epoxy resin, and epoxy curing agent. Exemplary photosensitizers include diazo oxides, as known in the art, e.g., naphthoquinone-1,2-diazide-(2)-5-sulphonic-p-methylphenyl ester, as in U.S. Pat. Nos. 3,046,120; 3,046,121; and 3,211,553, and diazo sulfones as known in the art, e.g., in U.S. Pat. Nos. 2,465,760; 3,113,865; and 3,661,573; and U.K. Pat. No. 1,277,428. The photosensitizers should be soluble in the solvent utilized for the coating solution applications. A particularly useful photosensitizer which is commercially available under the tradename "Diazo LL," is a naphthoquinone-(1,2)-diazide-sulfonic-(5)-naphthadiester, available from the Molecular Rearrangement Company. The positive acting photosensitizers of U.S. Pat. No. 4,148,654 are also useful in the present invention. A positive acting photosensitizer according to the present invention is a material which when struck by radiation, preferably actinic radiation, decomposes into a material which is more acidic than the photosensitizer. Preferably the original photosensitizer is neutral or basic to provide the greatest change in pH. The photosensitizer component need not provide any structural integrity by itself as it is blended into the mixture of urethane, polymerizable epoxy resin, and curing agent.

Concentration of the photosensitizer can be from about 10 parts by weight per 100 parts of novalac resin up to solution saturation.

Solvents utilized in the formation of the photosensitive solution are a matter of choice and convenience, and include, for example, methyl isobutyl ketone, methyl ethyl ketone, etc.

In practice, the solution can be simply coated by any known means onto a suport material, followed by drying at a temperature sufficient to cure the epoxy resin. In the case of a photoresist applied from a transfer film, the film backing should contain a release agent thereon, such as methyl cellulose, polyvinyl pyrrolidone, and copolymers of methyl vinyl ether and maleic anhydride to allow easy removal of the film backing, e.g., polyester from the photoresist layer. Following drying, the photoresist composition can be simply laminated by means of heat and pressure to a variety of substrates such as metals including copper, stainless steel, and gold, ceramics, glass, silicon dioxide, and organic polymers such as polyimide, epoxy, resin, and polysiloxanes and polyester.

Furthermore, the liquid photosensitive solution can be coated onto stainless steel for the purpose of manufacturing bimetallic printing plates by means of electrode deposition subsequent to imaging and development of the light sensitive material, or can be applied onto aluminum and silicated aluminum to manufacture printing plates, since the dry composition is oleophilic in nature.

Prior to coating onto a support, materials such as epoxy or amine functionalized alkoxy silane coupling agents can be added to the solution to promote the adhesion to substrates such as glass, silicon dioxide or other surfaces. Examples of such materials include γ-aminopropyltriethoxy silane and γ-glycidoxypropyl-trimethoxy silane.

Exposure can be undertaken by conventional techniques, e.g., carbon arc, etc., depending upon the radiation to which the photosensitizer is sensitive. Development of the image is undertaken using developers such as weak alkaline solutions, etc., which are conventional with the sensitizers utilized.

Our invention will now be more specifically described by the aid of the following non-limiting examples, wherein all parts are by weight unless otherwise specified.

EXAMPLE 1

A positive-acting composition was prepared by mixing the following components at room temperature:

| | |
|---|---|
| Methyl ethyl ketone | 27.6 |
| Resinox, tradename for a phenol/formaldehyde resin commercially available from Monsanto Company | 11.0 |
| 2,4,6-tris(dimethylaminomethyl)phenol | 0.23 |
| DDI-1410, tradename for an aliphatic (approximately 36 carbon atom bridging group) diisocyanate commerciallu available from General Mills Chemicals, Inc. | 1.00 |

The solution containing the above components was mixed until the solution viscosity (measured with a conventional Brookfield viscometer with a No. 2 spindle) stabilized at about 17 centipoise, after which the following were added:

| | |
|---|---|
| Methyl ethyl ketone | 11.0 |
| DER 331, tradename for diglycidyl ether of bisphenol A having an epoxy equivalent weight of 186 to 192, commercially available from the Dow Chemical Company | 3.31 |
| Phthalic anhydride | 0.26 |
| Diaminodiphenylsulfone | 0.13 |
| 1,2-naphthoquinone diazide-5-p-tert-butylphenylsulfonate | 3.6 |

After thorough mixing, the solution was knife coated onto 2 mil thick polyester sheeting which had been precoated with 50 milligrams per square foot of methyl cellulose, the photosensitive coating then being dried at 180° F. for 4 minutes. During drying, the epoxy resin was cured.

The resulting film was sufficiently flexible to withstand moderate flexing of the support without breaking away. The film was laminated to sheet copper using a heated roll laminator at 100° C. The polyester backing was stripped from the photoresist following lamination and the resist exposed through an original to a carbon arc for 50 seconds. The exposed resist was then developed by spraying the resist with a 1% aqueous sodium hydroxide solution for 2 minutes. The exposed copper could then be etched or electroplated in accordance with normal industrial techniques.

EXAMPLE 2

A positive-acting composition was prepared by mixing the following:

| | |
|---|---|
| Methyl ethyl ketone | 27.7 |
| Resinox | 11.0 |
| 1,4-diazabicyclo(2,2,2)octane | 0.01 |
| DDI-1410 | 1.23 | until the viscosity of the solution stabilized at about 50 centipoise.

Following the completion of the urethane formation, the following components were added to the solution:

| | |
|---|---|
| DER 331 | 3.0 |
| Phthalic anhydride | 0.3 |
| 1,2-naphthoquinone diazide-5-p-tert-butylphenylsulfonate | 3.0 |

After coating, exposing and developing as per Example 1, the film displayed excellent flexibility and photoresist properties.

EXAMPLE 3

A positive-acting composition was prepared by mixing:

| | |
|---|---|
| Methyl ethyl ketone | 27.7 |
| Resinox | 11.0 |
| 1,4-diazabicyclo(2,2,2)octane | 0.06 |
| DDI-1410 | 1.18 | until the viscosity of the solution stabilized.

The following components were then added to the solution:

| | |
|---|---|
| DER 331 | 2.15 |
| Diaminodiphenylsulfone | 0.40 |
| 1,2-naphthoquinone diazide-s-p-tert-butylphenylsulfonate | 3.0 |

After coating, drying, exposing and developing as per Example 1, the film displayed good flexibility and photoresist properties.

EXAMPLE 4

A photosensitive composition was prepared by mixing the following:

| | |
|---|---|
| The reaction product of "Resinox" and DDI-1410 given in Example 1 | 100 |
| DER 331 | 9 |
| Diaminodiphenylsulfone | 1.7 |
| "Diazo LL", tradename for a naphthoquinone(1,2)-diazide-(1)-sulfonic-(5)-naphtho-diester sold by Molecular Rearrangement, Inc. | 11.6 |
| γ-aminopropyltriethoxysilane | 0.26 |

The solution was coated onto silicated aluminum and dried at 180° F. The resulting composition was used as a printing plate, i.e., it was exposed to actinic radiation in an image-wise manner, developed, and inked. It was found that the film took ink and was functional as a printing plate.

EXAMPLE 5

The present example shows the desirability of curing the epoxy resin in the presence of the polyurethane to form an interlocking dual polymer network.

A positive-acting composition was prepared by mixing the following components at room temperature:

| | |
|---|---|
| Acetone | 27.6 |
| Resinox, tradename for a phenol/formaldehyde resin commercially available from Monsanto Company | 11.0 |
| 2,4,6-tris(dimethylaminomethyl) phenol | 0.23 |
| DDI-1410, tradename for an aliphatic diisocyanate commercially available from General Mills Chemicals, Inc. | 1.00 |

The solution containing the above components was mixed until the solution viscosity, measured with a conventional Brookfield viscometer stabilized at about 15 centipoise. This solution was combined with another one which had been prepared in the following way:

| | |
|---|---|
| Acetone | 11.0 |
| Epon 828, tradename for a diglycidyl ether of bisphenol A having an epoxy equivalent weight of 186 to 192 commercially available from the Shell Chemical Company | 3.31 |
| Phthalic anhydride | 0.26 |
| Diaminodiphenylsulfone | 0.13 |

These components of the second solution were boiled under reflux for 20 hours. To the combined solutions was added:

| | |
|---|---|
| 1,2-naphthoquinone diazide-5-p-tert butylphenylsulfonate | 3.6 |

After thorough mixing, the combined solution was knife coated onto 2 mil polyester sheeting which had been precoated with a 50 milligram per square foot methyl cellulose coating or precoated with a 50 milligram per square foot hydrolyzed copolymer formed from methylvinylether and malaic anhydride. The photosensitive coating was dried at 180° F. for 4 minutes.

The film was laminated to a sheet of copper using a heated roll laminator at 100° C. The polyester backing was stripped from the photoresist following lamination and the resist exposed through a photomask to UV light. The exposed portion of the resist was developed by spraying it with a 1% aqueous solution of sodium hydroxide.

The resists made in this manner were inferior to those made in the manner of Examples 1-4. Stripping of the polyester backing was difficult. Image quality was poorer and some bleeding of material from the unexposed resist image was noted. The resist also was more brittle than coatings described in the Examples 1-4. These coatings were still as good as many others used commercially.

What we claim is:

1. A positive-acting light sensitive composition comprising: (a) a crosslinked urethane resin formed by a catalyzed crosslinking of a non-heat-reactive novalac phenolic resin with a polyisocyanate compound in an amount equal to 3 to 20 percent by weight of the novalac resin; (b) an epoxy resin having an epoxide equivalent weight of less than about 400 and a curing agent therefor; and (c) a positive-acting photosensitizer which when struck by radiation decomposes into a material which is more acidic than said photosensitizer.

2. The composition of claim 1 wherein said novalac resin comprises from about 40 to about 80 weight percent of said composition, said polyisocyanate concentration is from about 6 to about 12 parts by weight per 100 parts of said novalac resin, said epoxy resin concentration is from about 20 to about 40 parts by weight per 100 parts of said novalac resin, and said photosensitizer concentration is at least about 10 parts by weight per 100 parts of said novalac resin.

3. The composition of claim 2 wherein said novalac resin comprises from about 50 to 70 weight percent of said composition.

4. The composition of claim 1 wherein said novalac resin is a novalac phenolic/formaldehyde resin.

5. The composition of claim 4 wherein said novalac resin has a molecular weight of from about 500 to about 1000.

6. The composition of claim 1 wherein said epoxy resin is a diglycidyl ether of bisphenol A.

7. The composition of claim 1 wherein said curing agent is selected from the group consisting of phthalic anhydride, diamino diphenylsulfone, and mixtures thereof.

8. A positive-acting light sensitive article comprising a substrate having coated on the surface thereof a light-sensitive composition comprising (a) a urethane resin formed by catalyzed crosslinking of a non-heat-reactive novalac phenolic resin with a polyisocyanate compound present in an amount equal to 3 to 20 percent by weight of said novalac resin; (b) a cured epoxy resin, said epoxy resin having an epoxide equivalent weight of less than about 400; and (c) a positive-acting photosensitizer which when struck by radiation decomposes into a material which is more acidic than said photosensitizer.

9. The article of claim 8 wherein said novalac resin comprises from about 40 to about 80 weight percent of said composition, said polyisocyanate concentration is from about 6 to about 12 parts by weight per 100 parts of said novalac resin, said epoxy resin concentration is from about 20 to about 40 parts by weight per 100 parts of said novalac resin, and said photosensitizer concentration is at least about 10 parts by weight per 100 parts of said novalac resin.

10. The article of claim 9 wherein said novalac resin comprises from 50 to 70 weight percent of said composition.

11. The article of claim 8 wherein said novalac resin is a novalac phenolic/formaldehyde resin.

12. The article of claim 8 wherein said novalac resin has a molecular weight of from about 500 to about 1000.

13. The article of claim 8 wherein said epoxy resin is a diglycidyl ether of bisphenol A.

14. The article of claim 8 wherein said substrate is a polyester.

15. The article of claim 8 wherein said substrate is aluminum.

16. The article of claim 8 wherein said substrate comprises a flexible backing having a release coating thereon.

17. The article of claim 8 wherein said substrate is stainless steel.

18. The article of claim 8 wherein said polyisocyanate comprises a diisocyanate having from 10 to 50 carbon atoms.

19. The article of claim 8 wherein said positive-acting photosensitizer is selected from the group consisting of diazo oxides and diazo sulfones.

20. The article of claim 9 wherein said positive-acting photosensitizer is selected from the group consisting of diazo oxides and diazo sulfones.

21. The article of claim 18 wherein said positive-acting photosensitizer is selected from the group consisting of diazo oxides and diazo sulfones.

22. The composition of claim 1 wherein said positive-acting photosensitizer is selected from the group consisting of diazo oxides and diazo sulfones.

23. The composition of claim 2 wherein said positive-acting photosensitizer is selected from the group consisting of diazo oxides and diazo sulfones.

24. The composition of claim 5 wherein said positive-acting photosensitizer is selected from the group consisting of diazo oxides and diazo sulfones.

* * * * *